(12) United States Patent
Kashiwakura

(10) Patent No.: US 8,212,154 B2
(45) Date of Patent: Jul. 3, 2012

(54) PRINTED WIRING BOARD

(75) Inventor: Kazuhiro Kashiwakura, Tokyo (JP)

(73) Assignee: NEC Corporation, Tokyo (JP)

( * ) Notice: Subject to any disclaimer, the term of this patent is extended or adjusted under 35 U.S.C. 154(b) by 917 days.

(21) Appl. No.: 12/198,273

(22) Filed: Aug. 26, 2008

(65) Prior Publication Data

US 2009/0056999 A1    Mar. 5, 2009

(30) Foreign Application Priority Data

Aug. 31, 2007 (JP) ................. 2007-225610

(51) Int. Cl.
*H05K 1/11* (2006.01)
(52) U.S. Cl. ........................ 174/262; 174/260
(58) Field of Classification Search .......... None
See application file for complete search history.

(56) References Cited

U.S. PATENT DOCUMENTS

| | | | |
|---|---|---|---|
| 6,639,154 B1 * | 10/2003 | Cartier et al. ............. | 174/255 |
| 6,828,513 B2 | 12/2004 | Kistner | |
| 7,045,719 B1 * | 5/2006 | Alexander et al. ......... | 174/262 |
| 7,492,146 B2 * | 2/2009 | Behziz ................... | 324/756.06 |
| 2007/0091581 A1 * | 4/2007 | Gisin et al. .............. | 361/782 |
| 2007/0278001 A1 * | 12/2007 | Mayder et al. ............ | 174/262 |

FOREIGN PATENT DOCUMENTS

| | | |
|---|---|---|
| CN | 101009972 A | 8/2007 |
| JP | 6-302964 A | 10/1994 |
| JP | 08274513 A | 10/1996 |
| JP | 2001244633 A | 9/2001 |
| JP | 2003086954 A | 3/2003 |
| JP | 2003158381 A | 5/2003 |
| JP | 2003217745 A | 7/2003 |
| JP | 2004165200 A | 6/2004 |
| JP | 2004327690 A | 11/2004 |
| JP | 2005005539 A | 1/2005 |
| JP | 2005175189 A | 6/2005 |
| JP | 2005351731 A | 12/2005 |
| WO | 2005086554 A | 9/2005 |

OTHER PUBLICATIONS

Chinese Office Action for CN200810211197.8 issued May 17, 2011.
Japanese Office Action for JP2007-225610 issued Jan. 31, 2012.

* cited by examiner

*Primary Examiner* — Ishwarbhai Patel

(57) ABSTRACT

A printed wiring board suppresses characteristic impedance mismatch that occurs when the printed wiring board is equipped with a through-type coaxial connector, and includes ground layers stacked in a plurality of layers via insulating layers; a through-hole; a clearance serving as an anti-pad provided in an area between the through-hole and the ground layers; and signal wiring extending from the through-hole to between prescribed ones of the ground layers through the clearance. The prescribed ones of the ground layers have a wiring-impedance adjustment area for adjusting the impedance of the signal wiring, the wiring-impedance adjustment area being arranged so as to overlap a portion of the signal wiring in the clearance.

20 Claims, 12 Drawing Sheets

(FIRST EXEMPLARY EMBODIMENT)

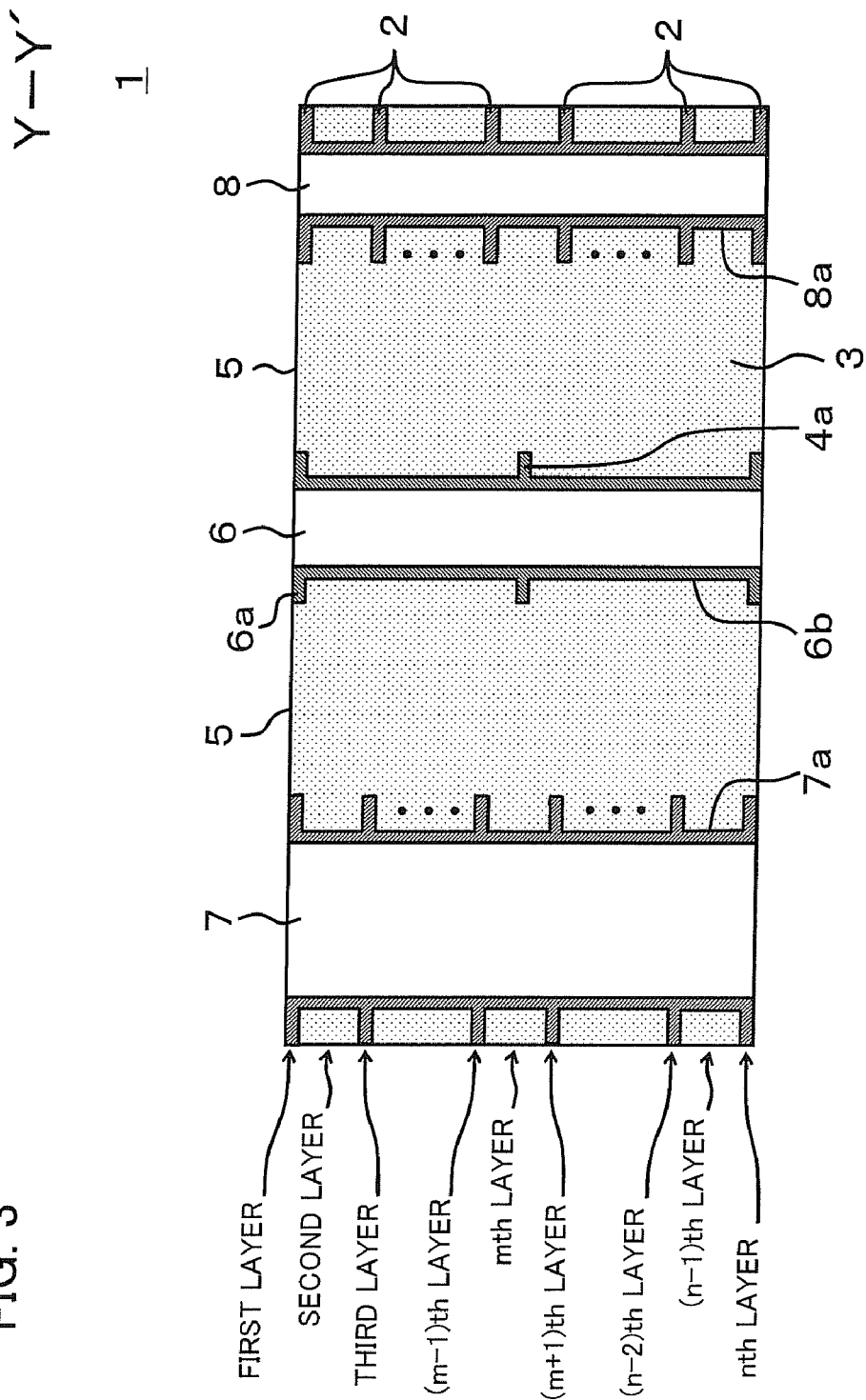

FIRST LAYER   (FIRST EXEMPLARY EMBODIMENT)

SECOND LAYER   (FIRST EXEMPLARY EMBODIMENT)

FIG. 5A (FIRST EXEMPLARY EMBODIMENT)
(m−1)th LAYER
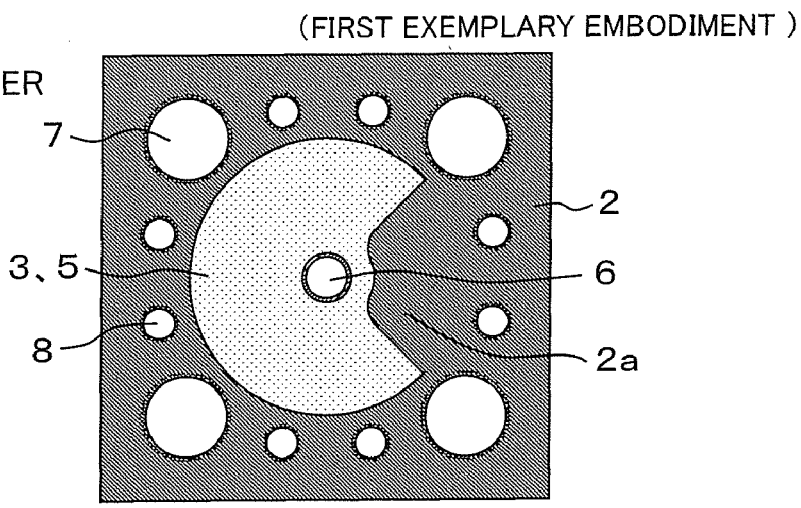
FIG. 5B (FIRST EXEMPLARY EMBODIMENT)
mth LAYER
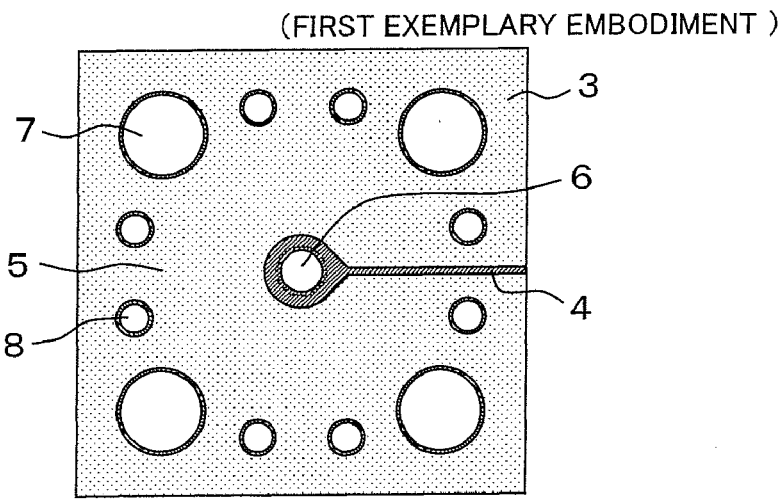
FIG. 5C (FIRST EXEMPLARY EMBODIMENT)
(m+1)th LAYER
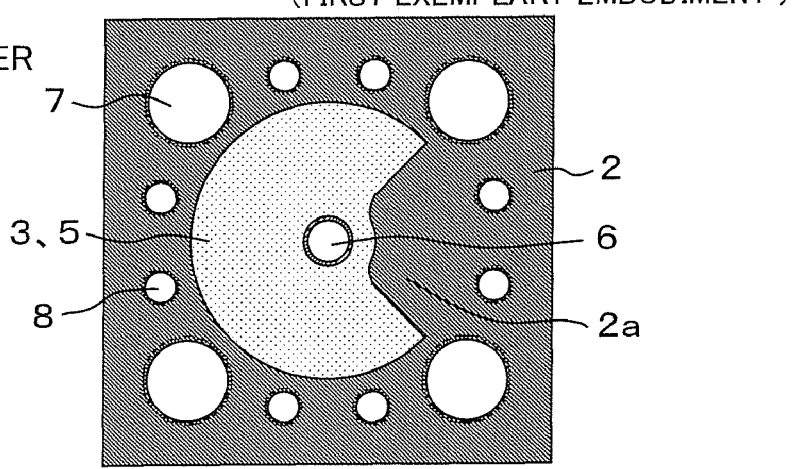

FIG. 6A (FIRST EXEMPLARY EMBODIMENT)
(n−1)th LAYER
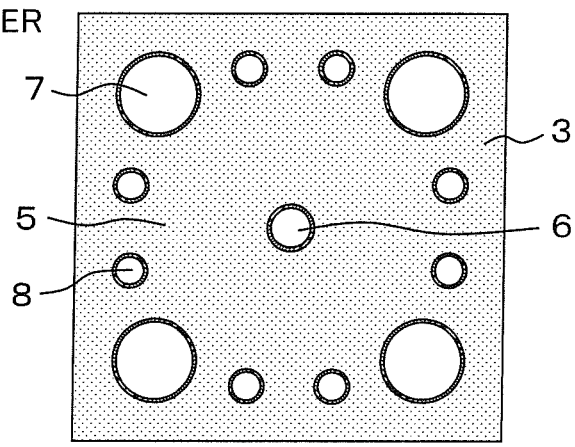
FIG. 6B (FIRST EXEMPLARY EMBODIMENT)
nth LAYER
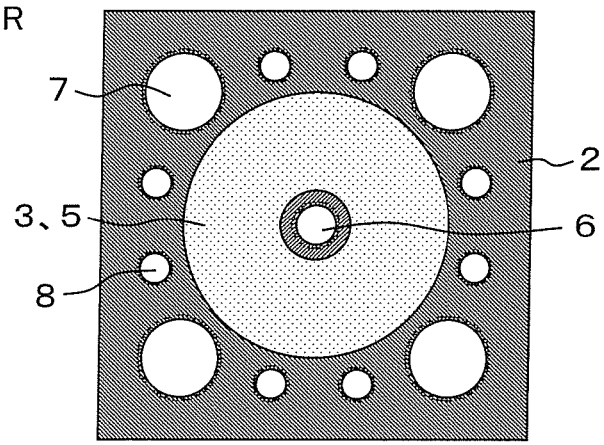

COAXIAL CROSS-SECTIONAL STRUCTURE

SECTIONAL STRUCTURE OF FIRST EXEMPLARY EMBODIMENT

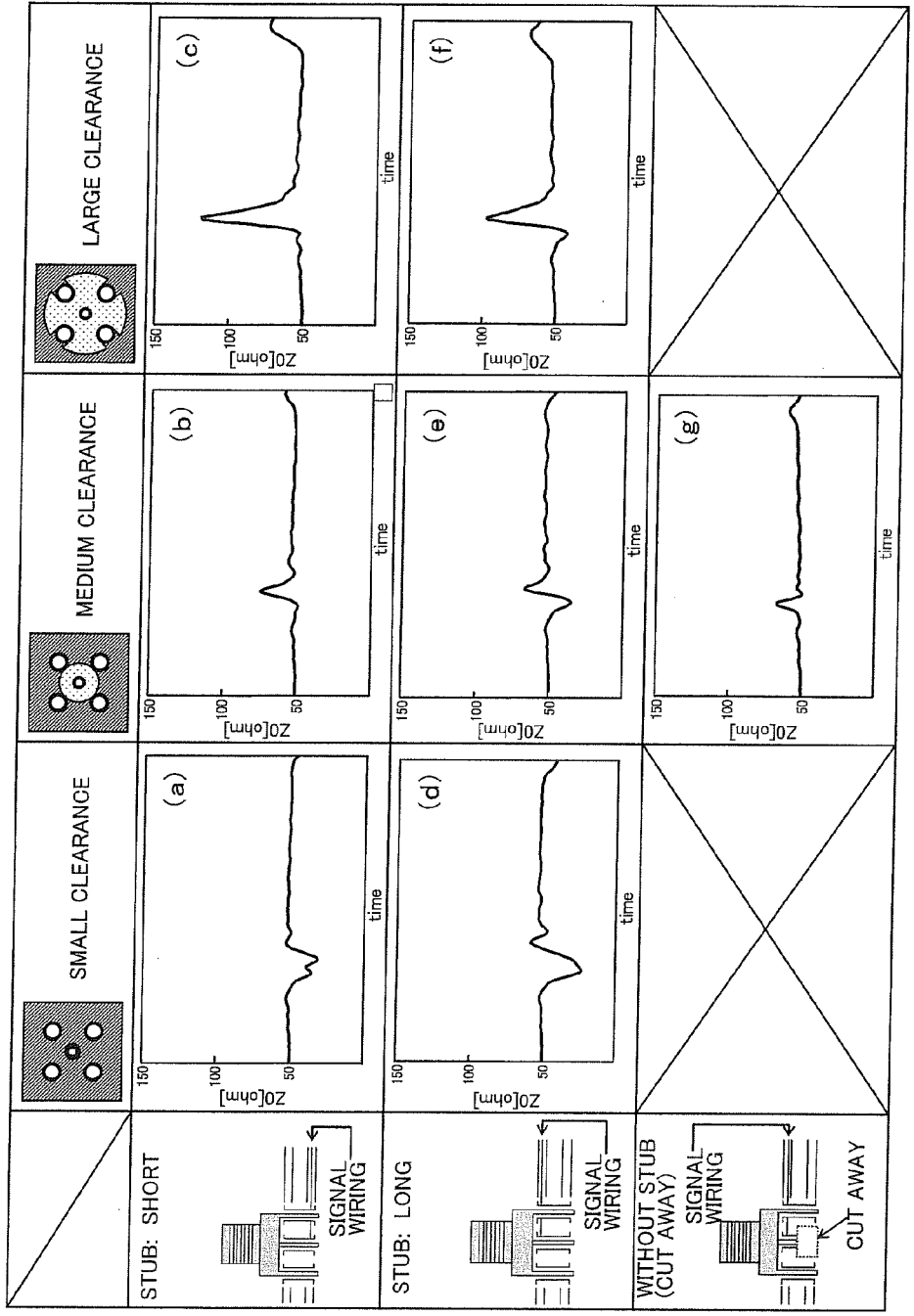

US 8,212,154 B2

PRINTED WIRING BOARD

REFERENCE TO RELATED APPLICATION

This application is based upon and claims the benefit of the priority of Japanese patent application No. 2007-225610, filed on Aug. 31, 2007, the disclosure of which is incorporated herein in its entirety by reference thereto.

TECHNICAL FIELD

This invention relates to a printed wiring board and, more particularly, to a printed wiring board having a through-hole for high-speed signal transmission.

BACKGROUND

Improvements in the processing capability of communications devices have been accompanied by a marked increase in signal speed. As signal speed increases, control of characteristic impedance is essential in order to assure a good high-frequency characteristic. With regard to transmission between printed wiring boards incorporated in communications devices, not only is use made of conventional backplane transmission but now there are also situations where use must be made of a coaxial cable through the intermediary of a coaxial connector. Further, even with conventional backplane transmission there are cases where measurement and evaluation are carried out in order to implement the backplane transmission, and in such cases a coaxial connector must be employed to connect the printed wiring board and the measurement equipment.

With regard to a case where a printed wiring board is equipped with a coaxial connector [e.g., a BNC (Bayonet Neil-Concelman) connector or SMA (Sub-Miniature Type-A) connector], the principal causes of a degraded characteristic, i.e., a characteristic impedance mismatch, are considered to be the following three: First, an impedance mismatch of the very through-hole formed in the printed wiring board for the purpose of accommodating the coaxial connector; second, an impedance mismatch at the portion connecting from the through-hole to signal wiring; and third, an impedance mismatch, which is ascribable to a stub (branch), that occurs in a signal through-hole. The following techniques have been proposed as means for eliminating such impedance mismatch:

[Patent Document 1] Japanese Patent Kokai Publication No. JP-P2003-217745A

[Patent Document 2] Japanese Patent Kokai Publication No. JP-P2004-165200A

[Patent Document 3] Japanese Patent Kokai Publication No. JP-P2004-327690A

[Patent Document 4] Japanese Patent Kokai Publication No. JP-P2005-175189A

[Patent Document 5] Japanese Patent Kokai Publication No. JP-P2005-351731A

[Patent Document 6] Japanese Patent Kokai Publication No. JP-8-274513A

[Patent Document 7] Japanese Patent Kokai Publication No. JP-P2005-5539A

[Patent Document 8] Japanese Patent Kokai Publication No. JP-P2003-86954A

SUMMARY

The entire disclosures of Patent Documents 1 to 8 are incorporated herein by reference thereto.

The following analysis has been given according to the present invention.

Patent Document 1 discloses a technique in which impedance mismatch between a daughterboard and backboard is accommodated by providing an electrically short stub in a transmission path in the vicinity of a through-hole in the daughterboard. With a high-speed signal, however, the rising edge of the signal is very steep. Consequently, even the short stub or a stub within the through-hole behaves as a transmission path and it is evident that this is a factor that gives rise to multiple reflection. Further, since connection to ground it achieved by the short stub, a problem which arises is an unintended offset voltage that develops in actual signal transmission.

Patent Document 2 discloses a technique relating to elimination of skew in a differential signal. However, this document is silent on the issue of suppressing reflection in a through-hole.

Patent Document 3 discloses adopting a coaxial-type through-hole in order to assure a return-current path in the through-hole of a printed wiring board. However, a solution relating to the stub of a through-hole that occurs in a multilayer printed wiring board is not indicated.

Patent Document 4 discloses the provision of an electrically conductive layer between two ground layers in order to assure a return-current path in the through-hole of a printed wiring board. However, as in the case of Patent Document 3, a solution relating to the stub of a through-hole in a multilayer printed wiring board is not indicated.

Patent Document 5 discloses a technique for constructing a test socket by inserting a metal probe into a through-hole of an electrically conductive pattern connected to ground. However, as in the case of Patent Document 3, no mention is made of through-hole stubs.

Patent Document 6 discloses a technique for connecting a waveguide and a substrate. However, this technique relates to the variability of impedance of a pseudo-waveguide constructed in a substrate, and it does not eliminate impedance mismatch relating to a through-hole.

Patent Document 7 discloses a technique in which a printed board is equipped with a coaxial connector or coaxial cable in a state in which impedance is matched high. However, this technique adjusts impedance by connecting a printed board having a different characteristic and an impedance matching board. The configuration of the portion from a through-hole to signal wiring is unclear, and this technique cannot be said to eliminate impedance mismatch at this portion.

Patent Document 8 discloses a technique in which the planar shape of adjacent openings and the cross-sectional shape of through-type conductors are each made elliptical, and the openings and penetrating conductors are arrayed along the direction of the short axes of the elliptical shapes, thereby diminishing the impedance component of the current path and suppressing simultaneous switching noise. However, the configuration of the portion from the through-type conductor to signal wiring is unclear, and this technique cannot be said to eliminate impedance mismatch at this portion.

It is a principal object of the present invention to suppress characteristic impedance mismatch that occurs when a printed wiring board is equipped with a through-type coaxial connector.

According to a first aspect of the present invention, there is provided a printed wiring board comprising: ground layers stacked in a plurality of layers via insulating layers; a first through-hole; a clearance serving as an anti-pad provided in an area between the first through-hole and the ground layers; and signal wiring extending from the first through-hole to between prescribed ones of the ground layers through the clearance. The prescribed ones of the ground layers have a wiring-impedance adjustment area for adjusting the impedance of the signal wiring. The wiring-impedance adjustment area is arranged so as to overlap a portion of the signal wiring in the clearance.

The meritorious effects of the present invention are summarized as follows.

In accordance with the present invention, it is possible to compensate for the characteristic impedance of the signal wiring that passes through the clearance. As a result, the performance of a coaxial connector connected to the through-hole can be exploited without degrading the signal band.

Other features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

FIG. 3 is a partial sectional view schematically illustrating the configuration of the printed wiring board according to the first exemplary embodiment taken along line Y-Y' in FIG. 1;

FIGS. 5A, 5B and 5C are partial sectional views of an (m−1)th layer, mth layer and (m+1)th layer, respectively, schematically illustrating the configuration of the printed wiring board according to the first exemplary embodiment;

FIGS. 6A and 6B are partial sectional views of (n−1)th and nth layers, respectively, schematically illustrating the configuration of the printed wiring board according to the first exemplary embodiment;

FIG. 8 is a diagram illustrating the results obtained by conducting an impedance analysis while changing the shapes of a clearance and stub in a state in which a printed wiring board according to an example for comparison is equipped with a coaxial connector;

Figure 11:
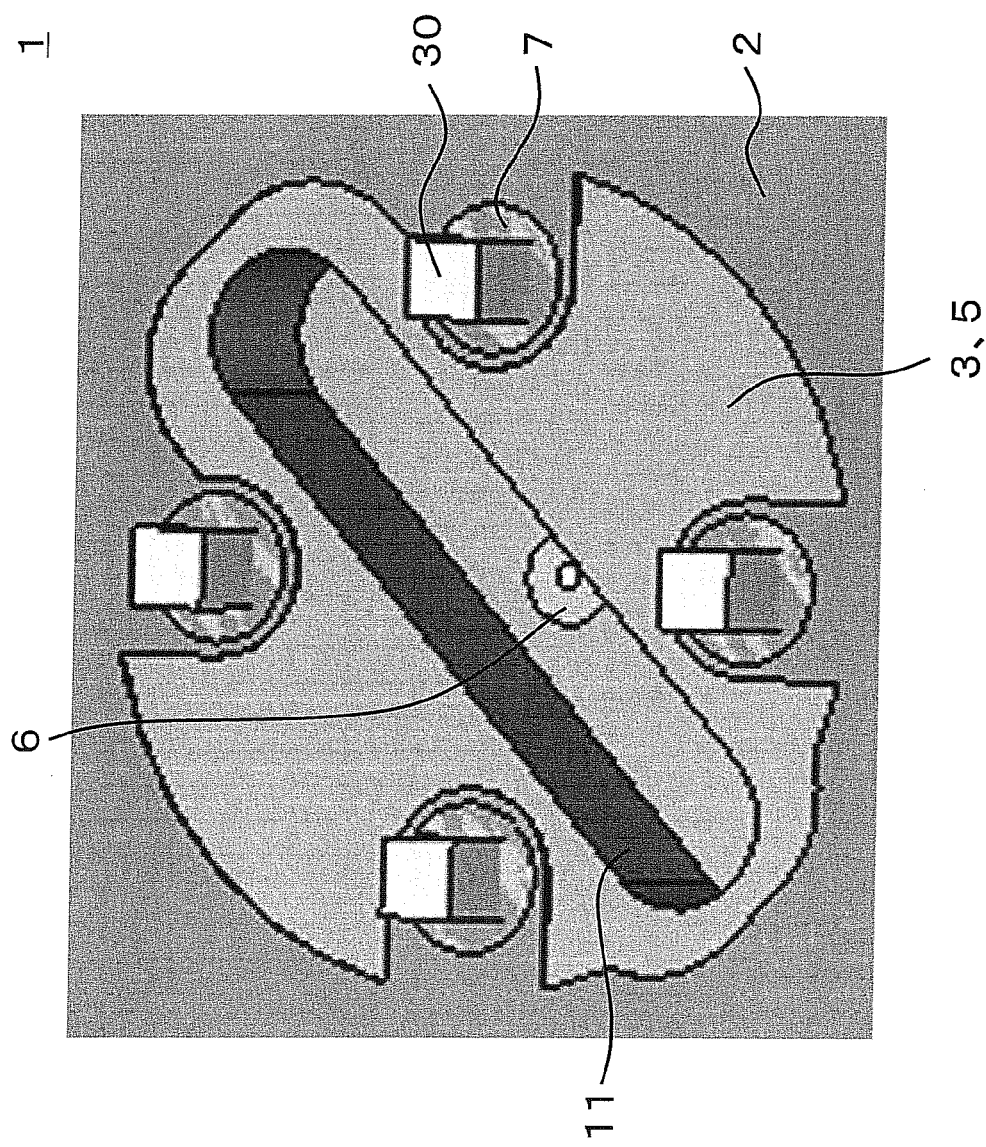
Figure 12:
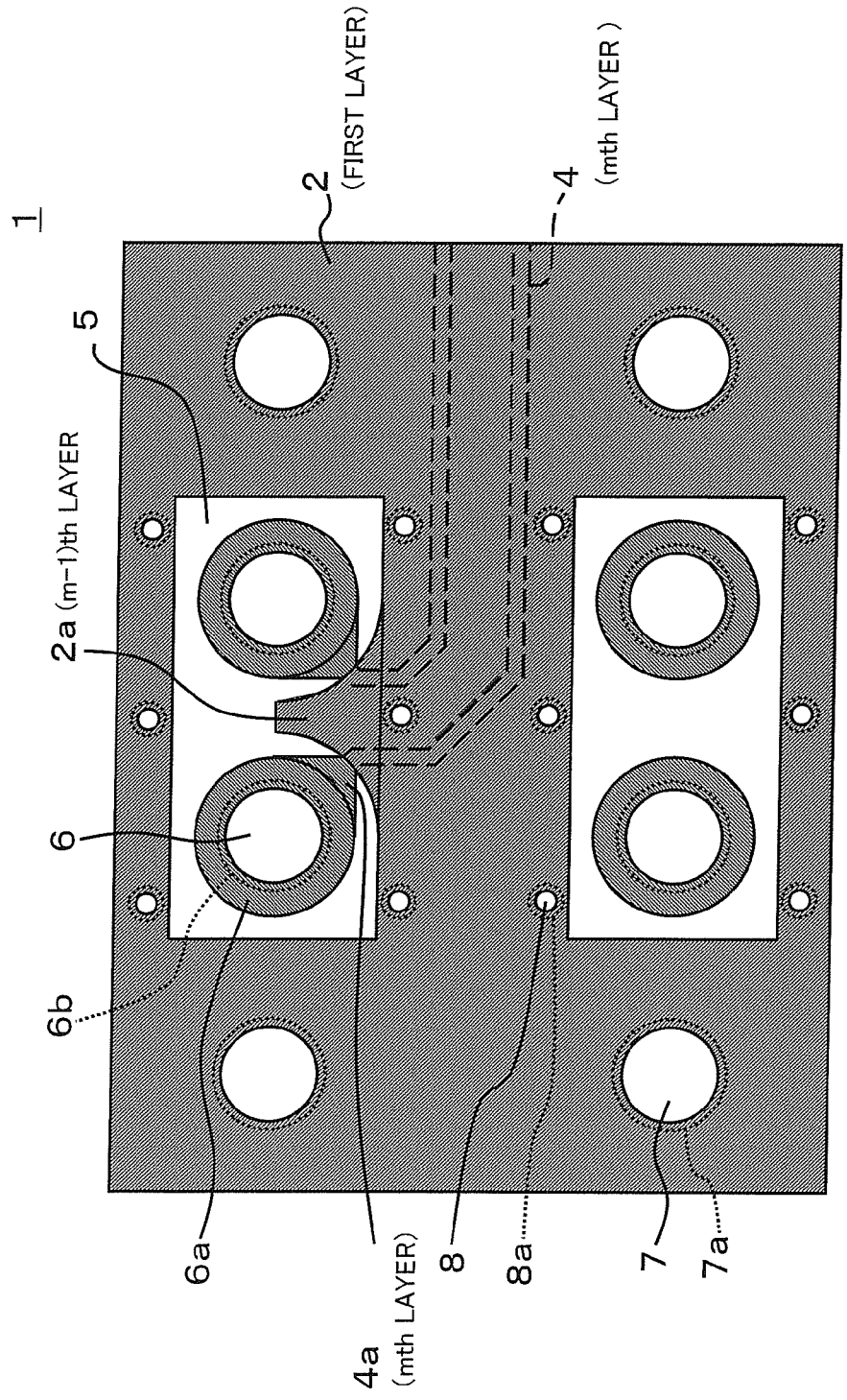

FIG. 11 is a partial perspective view schematically illustrating the configuration of the printed wiring board according to a second exemplary embodiment when seen from the side of a removed portion; and FIG. 12 is a partial plan view schematically illustrating the configuration of a printed wiring board according to a third exemplary embodiment of the present invention when seen from the side of a first layer;

PREFERRED MODES OF THE INVENTION

Figure 2:
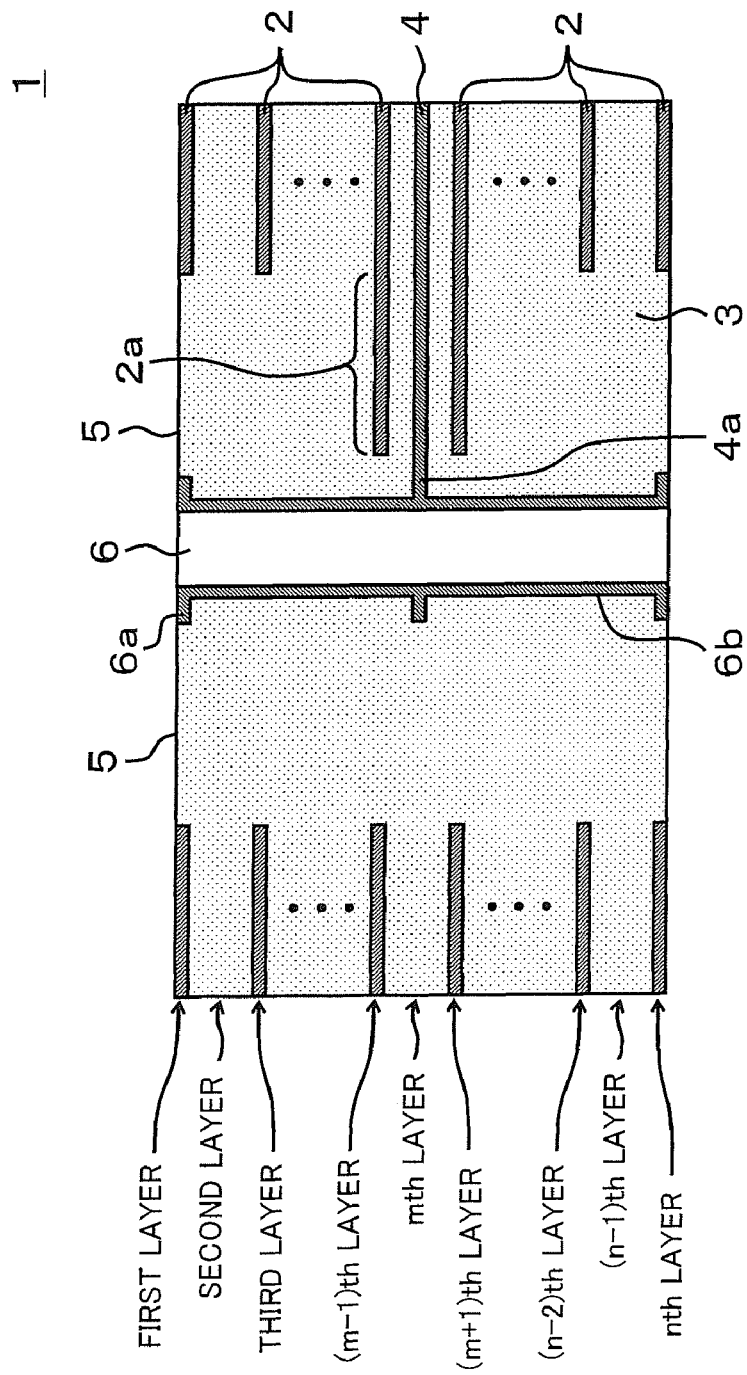
FIG. 2 is a partial sectional view schematically illustrating the configuration of the printed wiring board according to the first exemplary embodiment taken along line X-X' in FIG. 1.

A printed wiring board according to a mode of the present invention includes ground layers (ground layers 2 in FIG. 2) stacked in a plurality of layers via insulating layers (3 in FIG. 2); a first through-hole (signal-terminal through-hole 6 in FIG. 2); a clearance (5 in FIG. 2) serving as an anti-pad provided in an area between the first through-hole (signal-terminal through-hole 6 in FIG. 2) and the ground layers (ground layers 2 in FIG. 2); and signal wiring (4 in FIG. 2) extending from the first through-hole (signal-terminal through-hole 6 in FIG. 2) to between prescribed ones of the ground layers [an (m−1)th layer and (m+1)th layer of the ground layers 2 in FIG. 2] through the clearance (5 in FIG. 2). The prescribed ones of the ground layers [the (m−1)th layer and (m+1)th layer of the ground layers 2 in FIG. 2] have a wiring-impedance adjustment area (2a in FIG. 2), which is arranged so as to overlap a portion of the signal wiring (4 in FIG. 2) in the clearance (5 in FIG. 2), for adjusting the impedance of the signal wiring (4 in FIG. 2).

The wiring-impedance adjustment area may have a sector shape that widens as distance from the first through-hole increases.

The signal line may have a portion formed as a teardrop portion at the periphery of the first through-hole; and the teardrop portion may be arranged in an area where there is no overlap between the wiring layer and the wiring-impedance adjustment area in the clearance.

The printed wiring board may further comprise a plurality of second through-holes arranged at the periphery of the clearance and connected to each of the ground layers.

In a case where a single first through-hole exists in the clearance, the clearance, with the exception of the wiring-impedance adjustment area, may be formed into a circular shape the center of which is the axis of the first through-hole.

The first through-hole may be connected to a signal terminal of a coaxial connector; and second through-holes may be arranged so as to contact a concentric circle the center of which is the axis of the first through-hole and are connected to a ground terminal of the coaxial connector.

The printed wiring board may further comprise a third through-hole (or holes) arranged so as to contact a concentric circle at the outer periphery of the clearance, connected to each of the ground layers and arranged between the second through-holes.

In a case where a plurality of the first through-holes exist in the clearance, the clearance, with the exception of the wiring-impedance adjustment area, may be formed into a generally elongated shape, e.g., a rectangular shape, an elongated circle, or an elongated shape having opposing ends of semi-circles.

The insulating layers may be disposed in the area of the clearance except in an area of the signal wiring and in the wiring-impedance adjustment area.

In a case where the first through-hole has a stub structure branching from a portion of connection to the signal wiring, the printed wiring board may have a removed (cut-out) portion obtained by removing all or a part of at least the stub structure of the first through-hole to form a removed portion.

A portion of the insulating layers may be removed to form a groove-shaped portion as the removed portion.

First Exemplary Embodiment

Figure 1:
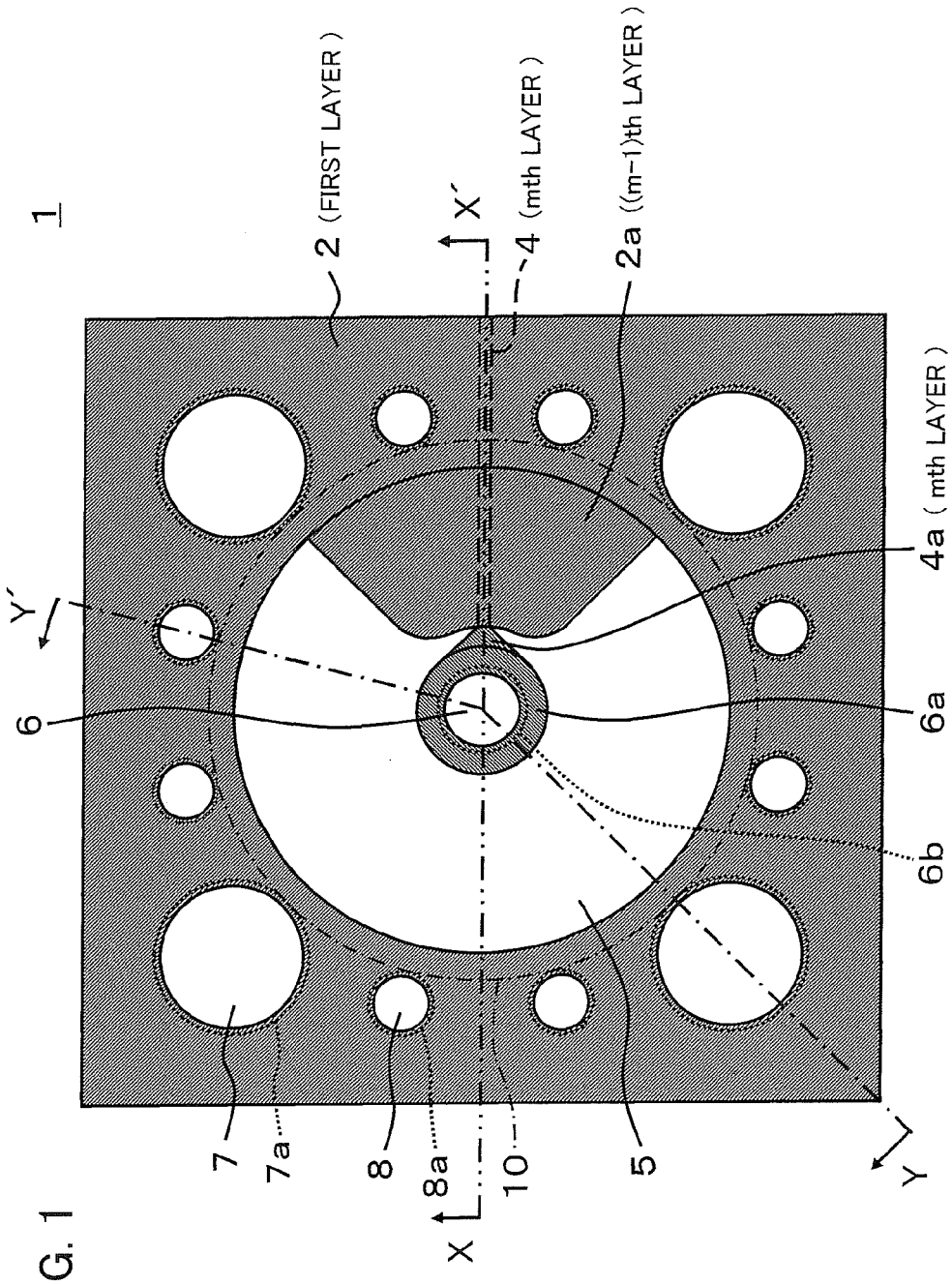
FIG. 1 is a partial plan view schematically illustrating the configuration of a printed wiring board according to a first exemplary embodiment of the present invention when seen from the side of a first layer.
Figure 4A:
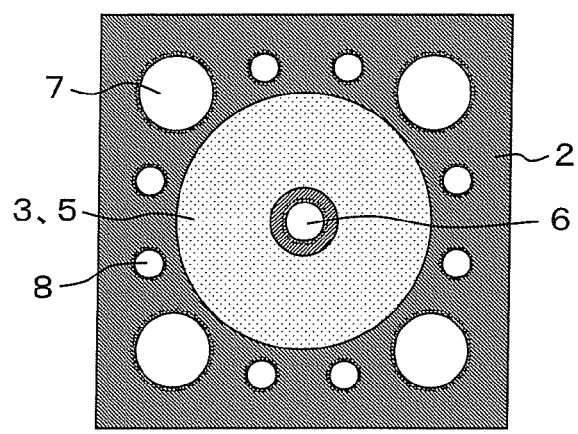
FIGS. 4A and 4B are partial sectional views of first and second layers, respectively, schematically illustrating the configuration of the printed wiring board according to the first exemplary embodiment.
Figure 4B:
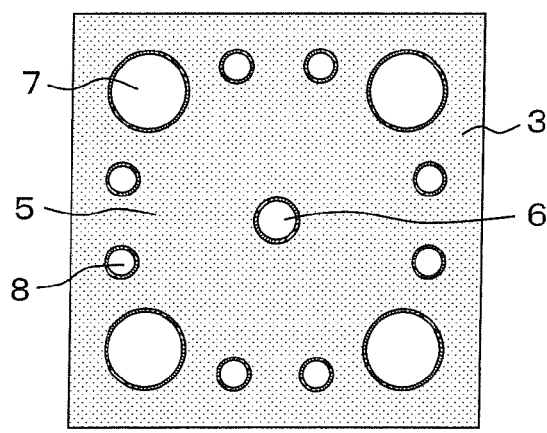

A printed wiring board according to a first exemplary embodiment of the present invention will be described with reference to the drawings. FIG. 1 is a partial plan view schematically illustrating the configuration of a printed wiring board according to a first exemplary embodiment of the present invention when seen from the side of a first layer. FIG. 2 is a partial sectional view schematically illustrating the configuration of the printed wiring board according to the first exemplary embodiment taken along line X-X' in FIG. 1. FIG. 3 is a partial sectional view schematically illustrating the configuration of the printed wiring board according to the first exemplary embodiment taken along line Y-Y' in FIG. 1. FIGS. 4A and 4B are partial sectional views of first and second layers, respectively, schematically illustrating the configuration of the printed wiring board according to the first exemplary embodiment. FIGS. 5A, 5B and 5C are partial sectional views of an (m−1)th layer, mth layer and (m+1)th layer, respectively, schematically illustrating the configuration of the printed wiring board according to the first exemplary embodiment. FIGS. 6A and 6B are partial sectional views of (n−1)th and nth layers, respectively, schematically illustrating the configuration of the printed wiring board according to the first exemplary embodiment.

It should be noted that insulating layer 3 is not shown in FIG. 1. Further, it is assumed in the drawings that signal wiring connected to a signal terminal of a coaxial connector is the signal wiring of an mth layer.

As shown in FIGS. 1 to 3, a printed wiring board 1 is a multilayer wiring board in which ground layers 2 and insulating layers 3 are stacked alternatingly and which is capable of being equipped with a coaxial connector (not shown). The printed wiring board 1 includes the ground layers 2, insulating layers 3, signal wiring 4, clearance 5, signal-terminal through-hole 6, ground-terminal through-hole 7 and impedance-adjustment ground through-hole 8.

The ground layers 2 are electrically conductive layers connected to a ground comprising a conductor such as copper. The ground layers 2 are stacked in a plurality of layers via the insulating layers 3. The signal wiring 4 is disposed between an (m−1)th layer and (m+1)th layer of the ground layers 2 via the insulating layers 3 (see FIG. 2). Formed in each layer of the ground layers 2 is a circular opening at a position corresponding to the clearance 5 placed about the outer periphery of the signal-terminal through-hole 6. An opening corresponding to the clearance 5 is formed in a circular shape in ground layers other than the (m−1)th layer and (m+1)th layer of the ground layers 2 [namely in the first layer, third layer, (n−2)th layer and nth layer of the ground layers 2) (see FIG. 4A and FIG. 6B). The (m−1)th layer and (m+1)th layer of the ground layers 2 have a wiring-impedance adjustment area 2a disposed in the opening areas of the ground layers other than the (m−1)th layer and (m+1)th layer (see FIG. 1). In the (m−1)th layer and (m+1)th layer of the ground layers 2, an opening corresponding to the clearance 5 is formed in a manner similar to the opening in the ground layers 2 other than the (m−1)th layer and (m+1)th layer, except where the wiring-impedance adjustment area 2a is present. The signal-terminal through-hole 6 is arranged inside the openings of the ground layers 2. The ground-terminal through-holes 7 and impedance-adjustment ground through-holes 8 are formed in each layer of the ground layers 2 at the outer peripheral portion of the opening corresponding to the clearance 5 so as to contact a concentric circle (line) 10 the center of which is the axis of the signal-terminal through-hole 6. Each layer of the ground layers 2 is connected to the ground-terminal through-hole 7 and impedance-adjustment ground through-hole 8 (see FIG. 3).

The wiring-impedance adjustment area 2a is for adjusting the characteristic impedance of the signal wiring 4 disposed in the clearance 5. The wiring-impedance adjustment area 2a is formed in the (m−1)th layer and (m+1)th layer of the ground layers 2 and is arranged so as to overlap a portion of the signal wiring 4 in the mth layer (see FIG. 1). The wiring-impedance adjustment area 2a is formed as an integral part of the ground layers 2 proper, exhibits the same potential as that of the ground layers 2 and is insulated from the signal-terminal through-hole 6 (see FIGS. 5A and 5B). It is preferred that the gap between the wiring-impedance adjustment area 2a and the signal-terminal through-hole 6 be such that the region devoid of conductors above and below the signal wiring 4 will be reduced to a minimum to a degree that will not cause problems in terms of manufacturing the substrate. The wiring-impedance adjustment area 2a has a sector shape that widens as distance from the signal-terminal through-hole 6 increases (i.e., a sector shape the radius of which extends to the intersection between the perimeter of the clearance and an extension line from the center of the signal-terminal through-hole 6 to the center of the ground-terminal through-hole 7). It should be noted that the wiring-impedance adjustment area 2a is not formed in the ground layers 2 other than the (m−1)th and (m+1)th layers thereof.

The insulating layers 3 are layers comprising an insulator such as epoxy resin. The insulating layers 3 are disposed between the ground layers 2. The signal wiring 4 is disposed in the insulating layer 3 in the portion between the (m−1)th layer and (m+1)th layer of the ground layers 2 (see FIG. 2). The insulating layers 3 are placed in the openings of the ground layers 2 that correspond to the clearance 5. Each insulating layer 3 is formed to have a drill-hole surface (hole wall surface) 6b at the center within the area of the clearance 5, and the signal-terminal through-hole 6 is formed in the wall surface of the drill-hole surface 6b (see FIG. 2). The insulating layer 3 is formed to have a drill-hole surface 7a at the outer peripheral portion of the area of clearance 5, and the ground-terminal through-hole 7 is formed in (on) the wall surface of the drill-hole surface 7a (see FIG. 3). The insulating layer 3 is formed to have a drill-hole surface 8a at the outer peripheral portion of the area of clearance 5, and the impedance-adjustment ground through-hole 8 is formed in the wall surface of the drill-hole surface 8a (see FIG. 3).

The signal wiring 4 is signal wiring comprising a conductor such as copper. The signal wiring 4 is formed in the mth layer of the insulating layer between the (m−1)th layer and (m+1)th layer of the ground layers 2 (see FIG. 2). The signal wiring 4 is disposed between the wiring-impedance adjustment areas 2a of the (m−1)th layer and (m+1)th layer of the ground layers 2. The signal wiring 4 is connected to the signal-terminal through-hole 6 and has a portion 4a formed as a teardrop at the periphery of the signal-terminal through-hole 6. The teardrop portion 4a is for preventing degradation of the impedance characteristic of the signal wiring 4 in the area where there is no overlap between the signal wiring 4 and wiring-impedance adjustment areas 2a. The signal wiring 4 is arranged so as to pass (route) between the impedance-adjustment ground through-holes 8.

The clearance 5 is a portion that serves as an anti-pad disposed in the area between the signal-terminal through-hole 6 and ground layers 2. The insulating layers 3 are disposed in the clearance 5. The clearance 5 is narrowed by the wiring-impedance adjustment areas 2a in the (m−1)th and (m+1)th layers.

The signal-terminal through-hole 6 is a through-hole for connection to the signal terminal (not shown) of a coaxial connector (not shown). The signal-terminal through-hole 6 is formed in conformity with the shape of the signal terminal (not shown) of the coaxial connector (not shown). The signal-terminal through-hole 6 comprises a conductor such as copper. The signal-terminal through-hole 6 is formed in the wall surface of the drill-hole surface 6b formed penetrating the insulating layers 3 at the center of the clearance 5, has lands 6a on the peripheral edges of its upper and lower surfaces and is connected to the teardrop portion 4a of the signal wiring 4.

The ground-terminal through-hole 7 is a through-hole for connection to the ground terminal (not shown) of a coaxial connector (not shown). The ground-terminal through-hole 7 is formed in conformity with the shape of the ground terminal (not shown) of the coaxial connector (not shown). The ground-terminal through-hole 7 comprises a conductor wall layer of such as copper. At the outer peripheral portion of the opening corresponding to the clearance 5 of the ground layers 2, the ground-terminal through-hole 7 is formed in the wall surface of the drill-hole surface 7a formed penetratingly so as to contact the concentric circle (line) 10 the center of which is the axis of the signal-terminal through-hole 6. The impedance-adjustment ground through-hole 8 is connected to each of the layers of the ground layers 2.

The impedance-adjustment ground through-holes 8 are ground through-holes for adjusting the characteristic impedance of the signal-terminal through-hole 6. The impedance-adjustment ground through-hole 8 comprises a wall layer of conductor such as copper. At the outer peripheral portion of the opening corresponding to the clearance 5 of the ground layers 2, the impedance-adjustment ground through-hole 8 is formed in the wall surface of the drill-hole surface 8a formed penetratingly so as to contact the concentric circle 10 the center of which is the axis of the signal-terminal through-hole 6. The ground-terminal through-hole 7 is connected to each of the layers of the ground layers 2. The impedance-adjustment ground through-holes 8 are arranged uniformly on the concentric circle 10. The spacing between the impedance-adjustment ground through-holes 8 is designed so as to assure enough spacing (interval) through which the signal wiring 4 may pass. If use is made of an SMA connector having a square size of an angle on the order of 1 cm, the arrangement is such that two of the impedance-adjustment ground through-holes 8 are provided between the ground-terminal through-holes 7 shown in FIG. 1.

Next, the operation of the printed wiring board according to the first exemplary embodiment will be described.

Figure 7A:
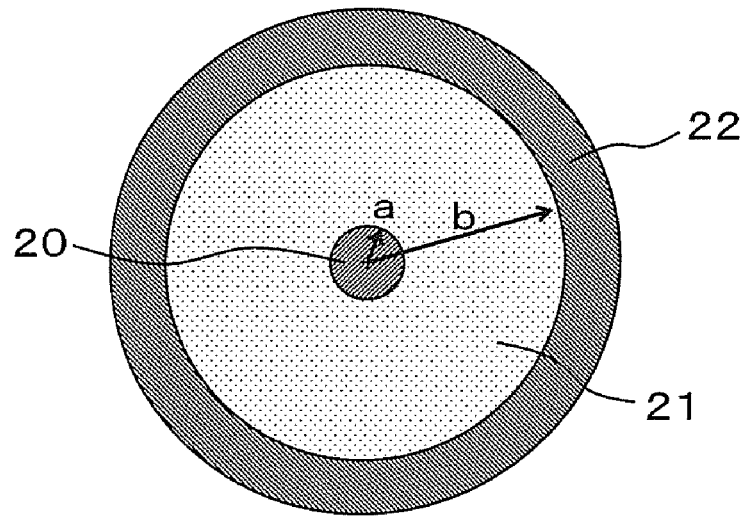
FIGS. 7A and 7B are diagrams schematically illustrating a coaxial cross-sectional structure and the cross-sectional structure of the printed wiring board according to the first exemplary embodiment of the invention, respectively.
Figure 7B:
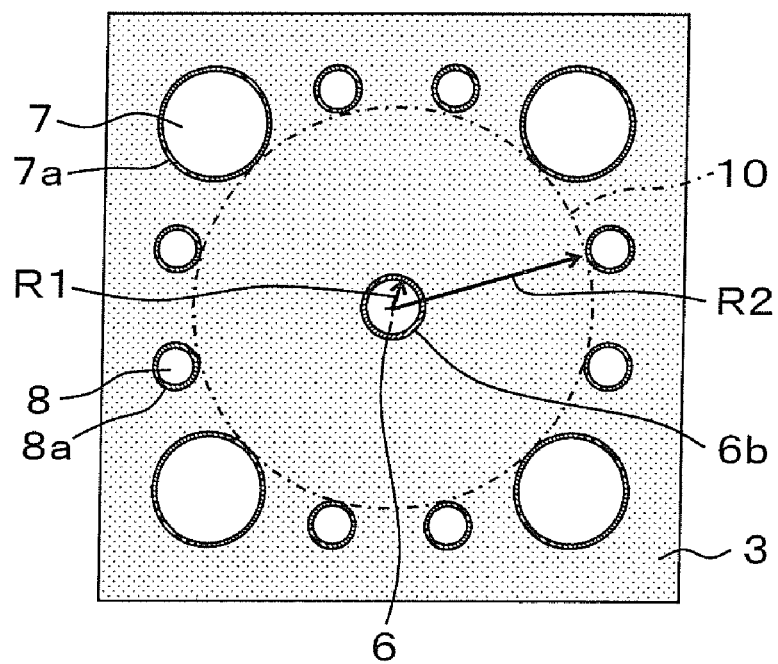

First, control of characteristic impedance of the signal-terminal through-hole 6 will be described with reference to the drawings. FIGS. 7A and 7B are diagrams schematically illustrating a coaxial cross-sectional structure and the cross-sectional structure of the printed wiring board, respectively.

In general, characteristic impedance $Z_0$ of a coaxial structure (see FIG. 7A) is found according to Equation (1) below.

$$Z_0 = \frac{60}{\sqrt{\varepsilon_r}} \log \frac{b}{a} \quad \text{Equation (1)}$$

According to Equation (1), the characteristic impedance $Z_0$ can be determined solely by radius a of a core wire (internal conductor) and inner diameter b of an external conductor. It should be noted that $\varepsilon_r$ represents specific inductivity and log indicates the natural logarithm.

FIG. 7B illustrates the structure of the first exemplary embodiment, in which the ground through-holes 7, 8 are arranged concentrically about the signal-terminal through-hole 6 at the center. This structure can be regarded as quasi-coaxial and approximates a coaxial structure. The characteristic impedance of a through-hole for a coaxial connector can be predicted by setting the drill radius (through-hole radius) R1 of the signal-terminal through-hole 6 to the radius a of FIG. 7A, setting the concentric circle radius R2 of the ground through-holes 7, 8 to the radius b of FIG. 7B, and substituting these into Equation (1).

Figure 9:
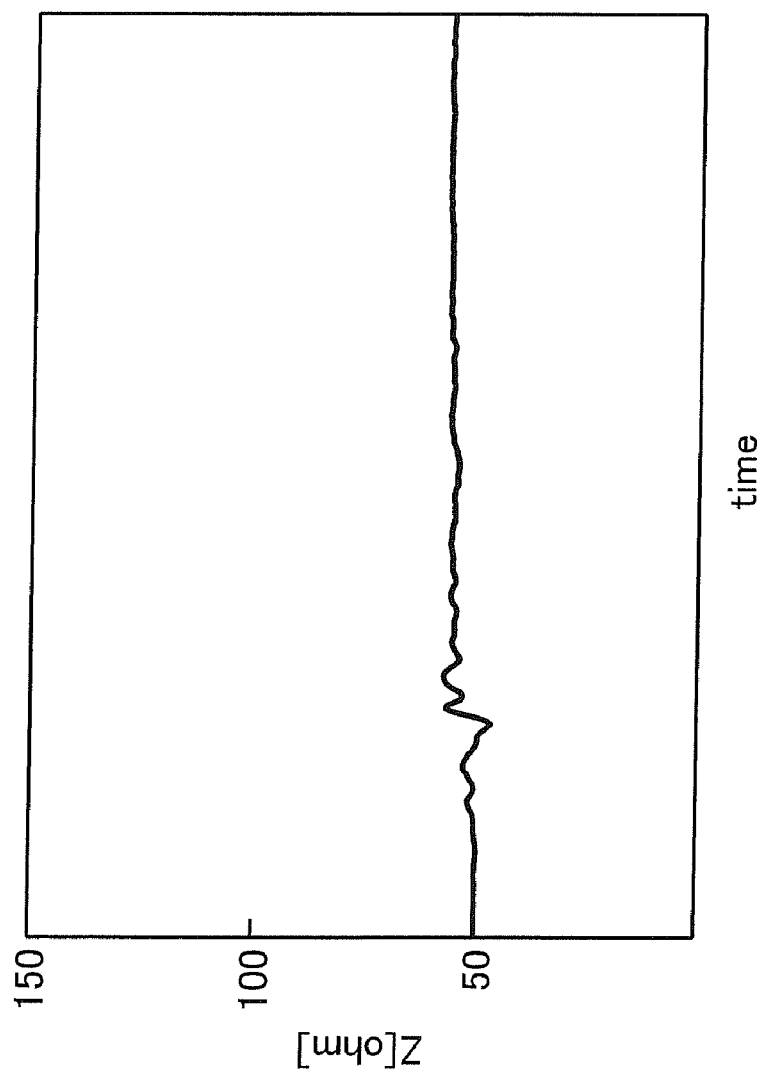
FIG. 9 is a diagram illustrating the results obtained by conducting an impedance analysis in a state in which the printed wiring board according to the first exemplary embodiment of the invention is equipped with a coaxial connector.

Next, reference will be had to the drawings to describe the wiring-impedance adjustment area of the clearance 5 while using an example for comparison purposes. FIG. 8 is a diagram illustrating the results obtained by conducting an impedance analysis while changing the shapes of the clearance and stub in a state in which a printed wiring board according to an example for comparison is equipped with a coaxial connector. FIG. 9 is a diagram illustrating the results obtained by conducting an impedance analysis in a state in which the printed wiring board according to the first exemplary embodiment of the invention is equipped with a coaxial connector. It should be noted that the examples for comparison are assumed not to have the wiring-impedance adjustment area 2a, teardrop portion 4a and impedance-adjustment ground through-holes 8 of the first exemplary embodiment.

With reference to FIG. 8 (the examples for comparison purposes), and focusing on the clearance, it can be confirmed that if the clearance is small, the designed value of characteristic impedance will be lowered owing to capacitive coupling between the signal-terminal through-hole and ground layers [see (a) of FIG. 8]. This would mean that as far as the characteristic impedance of the signal-terminal through-hole per se is concerned, a large clearance is preferable. If the clearance is enlarged, however, the result shows that the characteristic impedance of the signal wiring that passes through the clearance will be raised [see (b) and (c) of FIG. 8]. In view of the results shown at (a), (b) and (c) of FIG. 8, a structure that will assure the impedance of the signal wiring without applying capacitive coupling to the signal-terminal through-hole to the maximum degree, namely the addition of the wiring-impedance adjustment area 2a having the sector-shaped structure of FIG. 1, is effective. Further, it is effective to form the teardrop portion 4a of FIG. 1 and applying an impedance gradient in the very small area between the signal-terminal through-hole and wiring-impedance adjustment area. Accordingly, if the printed wiring board according to the first exemplary embodiment (see FIG. 1) is additionally provided with the wiring-impedance adjustment area 2a, teardrop portion 4a and impedance-adjustment ground through-holes 8 about the clearance 5 as center, it is possible to achieve a state in which the characteristic impedance is adjusted so as not to become raised or lowered, as illustrated in FIG. 9, i.e., the variation in the impedance is effectively and significantly reduced or suppressed.

If focus is directed toward a characteristic analysis in FIG. 8 based upon whether or not a stub exists, it can be confirmed that the stub brings about a lowering in impedance [see (d), (e) and (f) of FIG. 8]. Furthermore, it is also evident from the analytical result that the characteristic is vastly improved by removing the stub [see (g) of FIG. 8]. If the stub of the signal-terminal through-hole 6 of the printed wiring board according to the first exemplary embodiment (see FIG. 2) is cut our or away, as illustrated at the bottom case of FIG. 8, a further improvement in the characteristic is achieved.

In accordance with the first exemplary embodiment, it is possible to greatly improve upon (reduce) degradation of the signal band in a coaxial connector. There is a case study in the related art in which despite the fact that the band of a coaxial connector per se is greater than 20 GHz, the signal band does not even reach 5 GHz when a printed wiring board is equipped with the coaxial connector. On the other hand, by applying the first exemplary embodiment, the performance of a coaxial connector can be fully exploited, and this can be achieved without degrading the signal band.

Second Exemplary Embodiment

Figure 10:
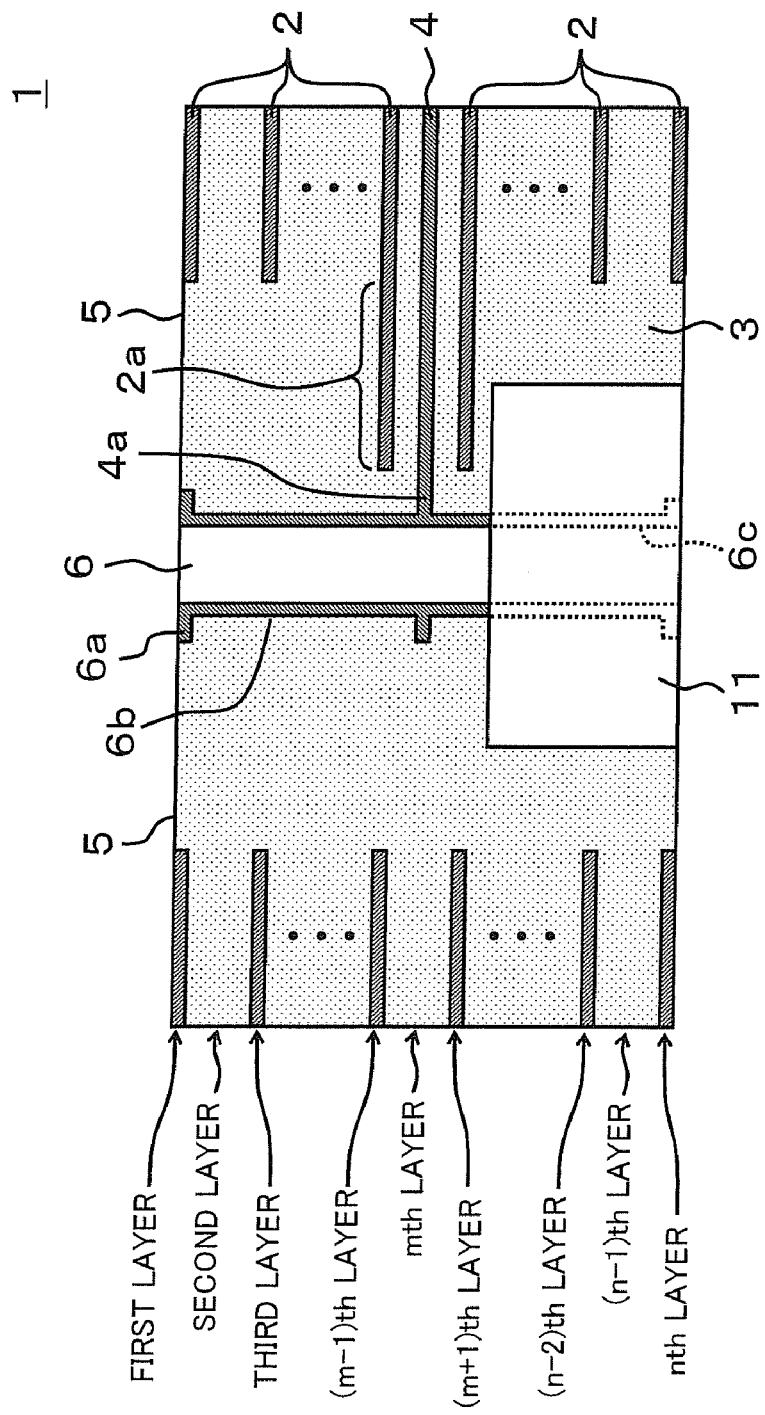
FIG. 10 is a partial sectional view schematically illustrating the configuration of a printed wiring board according to a second exemplary embodiment of the present invention.

A printed wiring board according to a second exemplary embodiment of the present invention will now be described with reference to the drawings. FIG. 10 is a partial sectional view schematically illustrating the configuration of a printed wiring board according to a second exemplary embodiment of the present invention, and FIG. 11 is a partial perspective view schematically illustrating the configuration of the printed wiring board according to a second exemplary embodiment when seen from the side of a removed portion. It should be noted that the sectional view of FIG. 10 corresponds to the view along line X-X' in FIG. 1.

In the second exemplary embodiment, the clearance 5 is enlarged so as to avoid the ground-terminal through-holes 7, the impedance-adjustment ground through-holes (corresponding to the through-holes 8 in FIG. 1) are dispensed with, and the stub (branch) produced by the signal-terminal through-hole 6 is (partially) removed or cut out. Other aspects of this exemplary embodiment are similar to the first exemplary embodiment.

If the mth layer in which the signal wiring 4 is formed is near a soldered surface (on the side of the nth layer), the influence of the stub of the signal-terminal through-hole 6 is regarded as being non-existent and removal of the stub is unnecessary, as in the case of the first exemplary embodiment (see FIG. 2). However, in a case where the mth layer used must be close to the part surface (on the side of the first layer) owing to the design requirements, it is necessary to physically remove the stub of the signal-terminal through-hole 6 at least partly. Even if the stub of the signal-terminal through-hole 6 is removed, the soldering work for joining the signal-terminal through-hole 6 and the signal terminal of the coaxial connector must be made easy to carry out. Accordingly, in a case where the stub of the signal-terminal through-hole 6 is removed, a groove-shaped removed cut-out portion 11 is provided, as shown in FIG. 11. The removed portion 11 has a width in the transverse (short side) direction large enough to permit the insertion of a soldering iron, and a length in the longitudinal (radial or diametral) direction large enough to allow the soldering operation. The removed portion 11 is formed by a method referred to as "backdrilling" (or "counter-boring"). That is, the stub constructing portion of the signal-terminal through-hole 6 is cut out, e.g., by drilling. A large drill diameter is used to assure enough space to allow insertion of the soldering iron. In accordance with the second exemplary embodiment, effects similar to those of the first exemplary embodiment can be obtained.

Third Exemplary Embodiment

A printed wiring board according to a second exemplary embodiment of the present invention will now be described with reference to the drawings. FIG. 12 is a partial plan view schematically illustrating the configuration of a printed wiring board according to a third exemplary embodiment of the present invention when seen from the side of the first layer.

The third exemplary embodiment is an example of a case where a backplane connector is applied. This example is an example of differential transmission. In order to prevent mismatch of characteristic impedance, the (m−1)th layer and (m+1)th layer of the ground layers 2 are provided with a wiring-impedance adjustment area 2a in the area of the clearance 5, the signal wiring 4 in the area between the wiring-impedance adjustment area 2a and signal-terminal through-hole 6 is provided with a teardrop portion 4a to thereby connect the signal-terminal through-hole 6 and the signal wiring 4, and the ground layers 2 on the outer periphery of the clearance 5 are provided with the impedance-adjustment ground through-holes 8. A plurality of the signal-terminal through-holes 6 are arranged in the clearance 5, and the clearance 5 is formed into a substantially rectangular shape (generally an elongated shape) with the exception of the wiring-impedance adjustment area 2a. The signal wiring 4 of the mth layer is disposed between the (m−1)th layer and (m+1)th layer of the ground layers 2, and also between the wiring-impedance adjustment areas 2a of the (m−1)th layer and (m+1)th layer. In accordance with the third exemplary embodiment, effects similar to those of the first exemplary embodiment are obtained.

Meanwhile, the wiring-impedance adjustment areas (pair) 2a are disposed between two neighboring signal-terminal through-holes 6, with a given distance from the signal-terminal through-holes 6, which make a substantially a Mt. Fuji-like shape. Each teardrop portion 4a is formed to extend substantially radially outwardly toward the corresponding signal-terminal through-hole 6 (curved surface thereof) so as to form a "teardrop" shape substantially up to a position that corresponds to the end surface of the wiring-impedance adjustment area 2a. The teardrop portion 4a is further connected to the signal wiring 4 (at mth layer), which further extends through an interval between the impedance-adjustment ground through-holes 8 so as to be led out the external end of the ground layer 2. The printed wiring board 1 has two elongated clearances 5 having generally a long quadrature-like profile at upper and lower stages, as viewed from a direction normal to the surface of the ground layer 2 (first layer), in which each two signal-terminal through-holes 6 are disposed. Along the sides (in this example, upper and lower sides) of each three impedance-adjustment ground through-holes 8 are arranged. For one signal-terminal through-hole 6, four impedance-adjustment ground through-holes 8 are allocatedly arranged near the four corners of the clearance 5. This arrangement is so designed as to fulfill the predetermined impedance relationship, i.e., so as to contact the (imaginary) circle of the radius R1 centered at the center of the signal-terminal through-hole 6 (see FIG. 7B).

Ground-terminal through-holes 7 are almost equivalently disposed at every four corners of the ground layer 2 (first layer). The signal wiring 4 (mth layer) is disposed between the (m−1)th and (m+1)th layers, while the remaining layer structure may be based on FIG. 2.

In the illustrated case, for instance, two signal wirings 4 (mth layer) are extend in parallel to one another, and deflected to the right at the central part of the board 1 to further extend horizontally in parallel to reach the right end of the ground layer 2.

The layout of the signal wiring 4 is not limited to that shown in FIG. 12, but can be any desired one, e.g., in a right-left symmetric fashion, or the like in accordance with the need for layout. The teardrop portions 4a can be disposed at any desired angular position about the center of signal-terminal through-hole 6, e.g., can be at any of one upper and lower right corners of the clearance 5. In the clearance 5 of the lower stage, the illustration of wiring-impedance adjustment areas 2a and teardrop portions 4a are omitted, however, may be present likewise at the upper stage, or otherwise, too. It should be taken care of not creating interference between the signal wirings of the upper and lower stages. (For instance, right-left symmetric layout will meet the requirement). In this regard, the angular positions of the teardrop portions 4a may be modified, as mentioned above, and further it is possible to dispose the signal wiring 4 at mth and other layers for avoiding positional interference between the signal wirings 4 and the associated pair of ground layers 2 having the impedance adjustment areas 2a.

The shape of the clearance 5 is not limited to that illustrated in FIG. 12, and may assume other shape, e.g., which may be an elongated circle having two end sides of a semi-circular configuration. In such case, the impedance-adjustment ground through-holes 8 should be also disposed correspondingly, as far as the basic requirements for suppressing the impedance variations, too.

As many apparently widely different exemplary embodiments of the present invention can be made without departing from the spirit and scope thereof, it is to be understood that the invention is not limited to the specific exemplary embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A printed wiring board comprising:
   ground layers stacked in a plurality of layers via insulating layers;
   a first through-hole;
   a clearance serving as an anti-pad provided in an area between said first through-hole and said ground layers; and
   signal wiring extending from said first through-hole to between prescribed ones of said ground layers through said clearance;
   wherein the prescribed ones of said ground layers have a wiring-impedance adjustment area for adjusting the impedance of said signal wiring, said wiring-impedance adjustment area being arranged so as to overlap a portion of said signal wiring in said clearance;
   wherein said clearance of said ground layers is kept at a constant length in an area other than said wiring-impedance adjustment area.

2. The printed wiring board according to claim 1, wherein said wiring-impedance adjustment area has a sector shape that widens as distance from said first through-hole increases.

3. The printed wiring board according to claim 1, wherein said signal line has a portion formed as a teardrop portion at the periphery of said first through-hole; and
   said teardrop portion is arranged in an area where there is no overlap between said wiring layer and said wiring-impedance adjustment area in said clearance.

4. The printed wiring board according to claim 3, wherein said teardrop portion extends to an inner periphery of said wiring-impedance adjustment area.

5. The printed wiring board according to claim 1, further comprising a plurality of second through-holes arranged at the periphery of said clearance and connected to each of said ground layers.

6. The printed wiring board according to claim 5, wherein said second through-holes are disposed so as to adjust the impedance.

7. The printed wiring board according to claim 1, wherein a single first through-hole exists in said clearance, and said clearance, with the exception of said wiring-impedance adjustment area, is formed into a circular shape the center of which is the axis of said first through-hole.

8. The printed wiring board according to claim 7, wherein said first through-hole is connected to a signal terminal of a coaxial connector; and
   second through-holes are arranged so as to contact a concentric circle the center of which is the axis of said first through-hole and are connected to a ground terminal of the coaxial connector.

9. The printed wiring board according to claim 8, further comprising a third through-hole arranged so as to contact a concentric circle at the outer periphery of said clearance, connected to each of said ground layers and arranged between said second through-holes.

10. The printed wiring board according to claim 1, wherein a plurality of said first through-holes exist in said clearance, and said clearance, with the exception of said wiring-impedance adjustment area, is formed into a rectangular shape.

11. The printed wiring board according to claim 1, wherein the insulating layers are disposed in the area of said clearance except in an area of said signal wiring and in said wiring-impedance adjustment area.

12. The printed wiring board according to claim 1, wherein said first through-hole has a stub structure branching from a portion of connection to said signal wiring, and said printed wiring board has a removed portion obtained by removing all or a part of at least the stub structure of said first through-hole.

13. The printed wiring board according to claim 12, wherein a portion of the insulating layers is removed to form a groove-shaped portion in said removed portion.

14. The printed wiring board according to claim 12, wherein said removed portion extends diametrally centered about the center axis of said first through-hole to such an extent that allows soldering thereto.

15. The printed wiring board according to claim 1, wherein said overlapped portion of said signal wiring is interposed by a pair of wiring-impedance adjustment areas disposed adjacent to said overlapping portion.

16. The printed wiring board according to claim 1, wherein said clearance is formed in a generally elongated shape provided that at least two of said first through-holes exist in said clearance.

17. The printed wiring board according to claim 16, wherein said wiring-impedance adjustment area for each of the first through-holes is disposed on the inner periphery of said generally elongated clearance in a region lying between neighboring two of said first through-holes.

18. A printed wiring board comprising:
   ground layers stacked in a plurality of layers via insulating layers;
   a first through-hole;
   a clearance provided in an area between said first through-hole and said ground layers;
   signal wiring extending from said first through-hole to between prescribed ones of said ground layers through said clearance; and a plurality of second through-holes arranged at the periphery of said clearance and connected to each of said ground layers so as to adjust the wiring impedance;

wherein the prescribed ones of said ground layers have a wiring-impedance adjustment area for adjusting the impedance of said signal wiring, said wiring-impedance adjustment area being arranged so as to overlap a portion of said signal wiring in said clearance;

wherein said clearance of said ground layers is kept at a constant length in an area other than said wiring-impedance adjustment area.

19. The printed wiring board according to claim 18, wherein said signal line has a portion formed as a teardrop portion at the periphery of said first through-hole for adjusting the wiring-impedance.

20. The printed wiring board according to claim 19, wherein a plurality of said first through-holes exist in said clearance being formed in a substantially elongated shape.

* * * * *